(12) United States Patent
Watanabe et al.

(10) Patent No.: US 7,375,423 B2
(45) Date of Patent: May 20, 2008

(54) SEMICONDUCTOR DEVICE

(75) Inventors: Takanori Watanabe, Bunkyo (JP); Tsuyoshi Koyashiki, Kawasaki (JP); Hiroyuki Ozawa, Kawasaki (JP); Chiaki Mimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 32 days.

(21) Appl. No.: 11/183,844

(22) Filed: Jul. 19, 2005

(65) Prior Publication Data

US 2006/0175698 A1    Aug. 10, 2006

(30) Foreign Application Priority Data

Feb. 4, 2005    (JP)    ............... 2005-029142

(51) Int. Cl.
*H01L 23/52*    (2006.01)
(52) U.S. Cl. ............... 257/691; 257/692; 257/758; 257/E23.153; 257/E23.145
(58) Field of Classification Search ........... 257/691, 257/E23.153
See application file for complete search history.

(56) References Cited

U.S. PATENT DOCUMENTS

2004/0075174 A1* 4/2004 Tamaru et al. ............ 257/758

FOREIGN PATENT DOCUMENTS

JP    2000-307063    11/2000

OTHER PUBLICATIONS

Office Action dated Sep. 7, 2007, issued in corresponding Chinese Application No. 200510084958.4.

* cited by examiner

*Primary Examiner*—Tu-Tu V. Ho
(74) *Attorney, Agent, or Firm*—Westerman, Hattori, Daniels & Adrian, LLP.

(57) ABSTRACT

A semiconductor device includes a pad composed of plural wiring layers and a power supply ring to provide a power supply provided through the pad for the power supply to an internal circuit, and the pad for the power supply and the power supply ring are connected by vias provided respectively above and below the power supply ring. Consequently, even if the width of the pad is narrowed, the number of vias disposed to connect the pad for the power supply and the power supply ring can be at least doubled compared to the conventional one to increase the amount of a current which can be provided to the power supply ring, which makes it possible to provide the sufficient current from outside to the power supply ring even in the semiconductor device with the narrow-width pad.

16 Claims, 5 Drawing Sheets

F I G. 1A
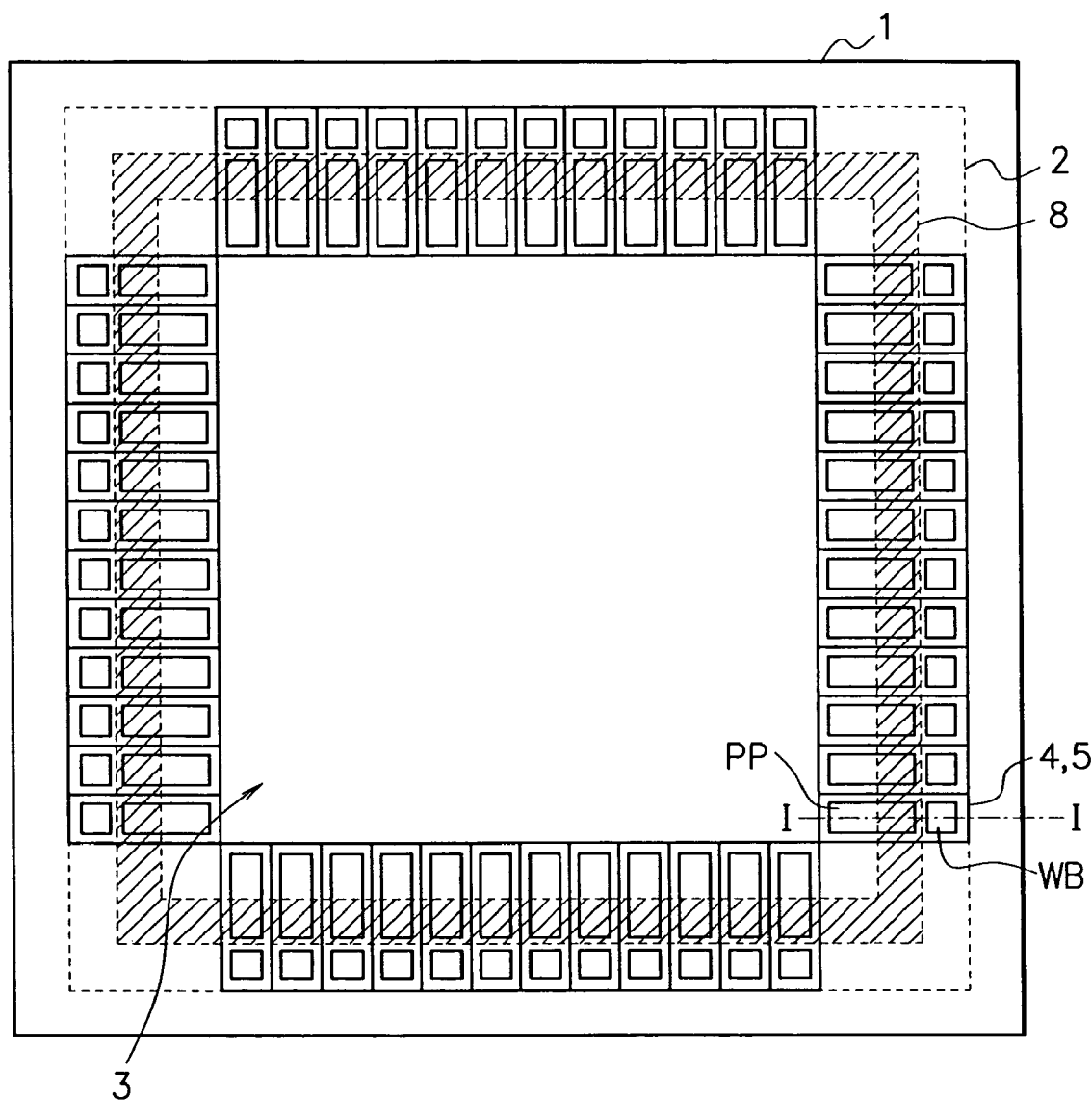
F I G. 1B
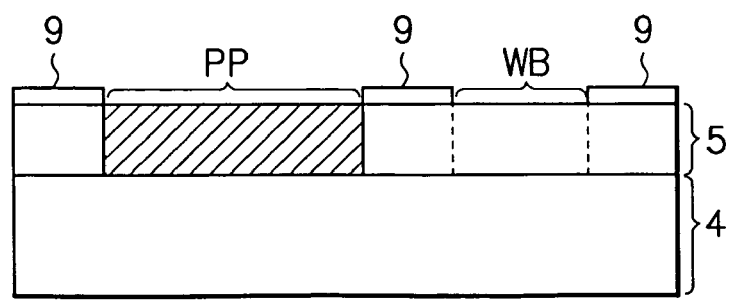

UPPERMOST LAYER
(FIRST LAYER)

SECOND LAYER

THIRD LAYER

FOURTH LAYER
(POWER SUPPLY RING)

FIFTH LAYER

I-I SECTION

II-II SECTION

FIG. 3A UPPERMOST LAYER (FIRST LAYER)
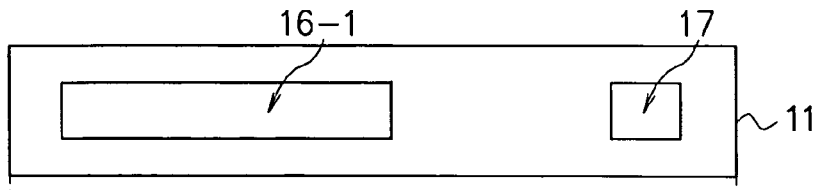
FIG. 3B SECOND LAYER
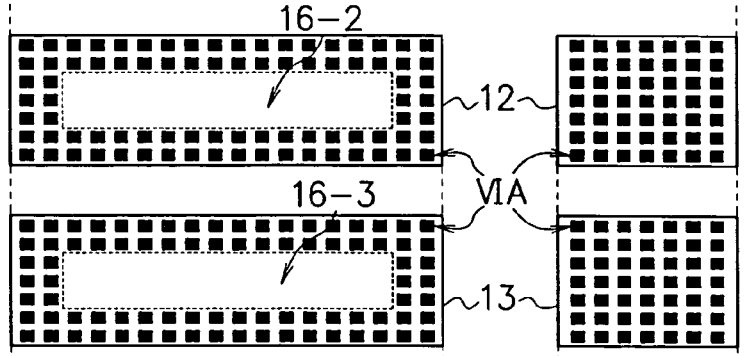
FIG. 3C THIRD LAYER
FIG. 3D FOURTH LAYER (POWER SUPPLY RING)
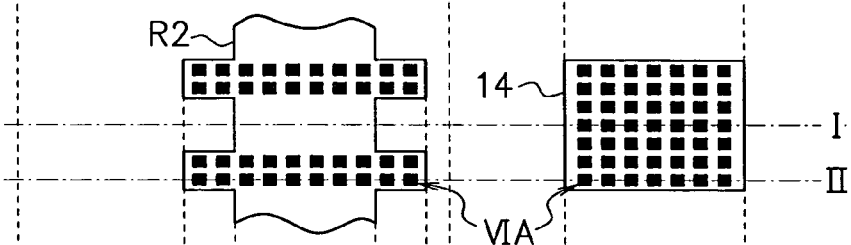
FIG. 3E I-I SECTION
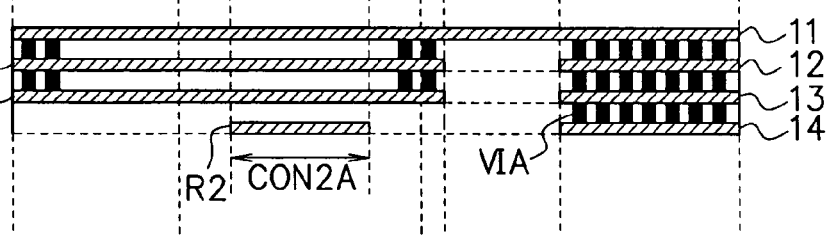
FIG. 3F II-II SECTION
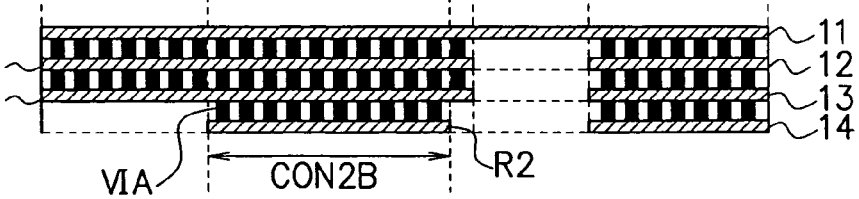

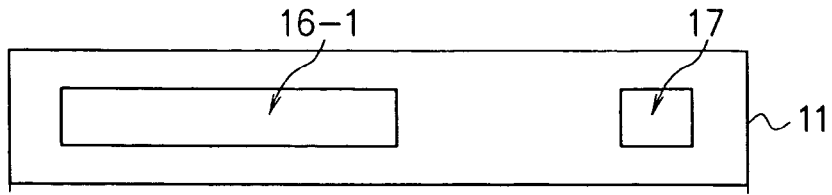
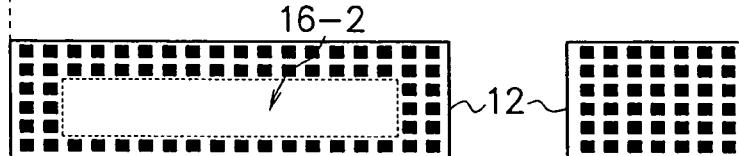
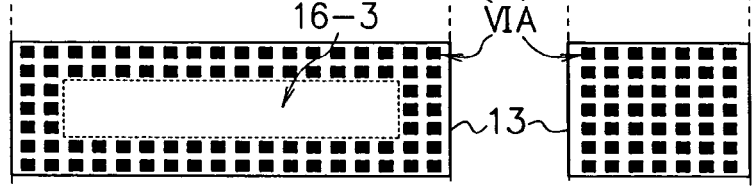
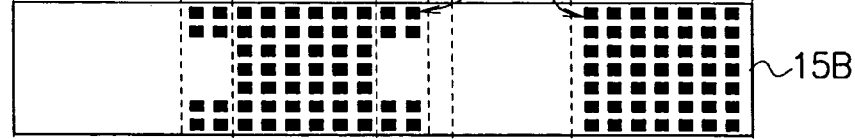
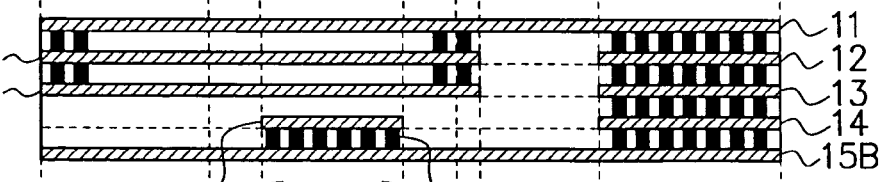
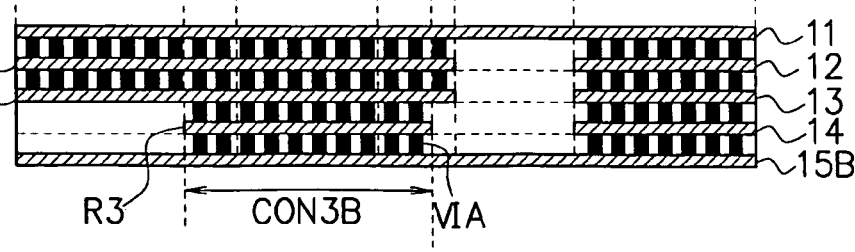

UPPERMOST LAYER (FIRST LAYER)

SECOND LAYER

THIRD LAYER

FOURTH LAYER (POWER SUPPLY RING)

I-I SECTION

II-II SECTION

US 7,375,423 B2

SEMICONDUCTOR DEVICE

CROSS-REFERENCE TO RELATED APPLICATIONS

This application is based upon and claims the benefit of priority from the prior Japanese Patent Application No. 2005-029142, filed on Feb. 4, 2005, the entire contents of which are incorporated herein by reference.

BACKGROUND OF THE INVENTION

1. Field of the Invention

The present invention relates to a semiconductor device provided with a power supply ring to provide a power supply to an internal circuit.

2. Description of the Related Art

Conventionally, in some semiconductor devices such as an LSI, a ring-shaped wiring called a power supply ring is provided therein to supply a power supply from outside to an internal circuit. In the semiconductor device provided with the power supply ring, a pad for a power supply connected to an external power supply (power supply terminal) (or a power supply wiring connected to this pad) and the power supply ring are connected by vias (through-hole contacts), and the power supply ring and the internal circuit (in more detail, the power supply wiring in the internal circuit) are connected by vias and wirings as required. Therefore, the power supply from outside supplied to the pad for the power supply is supplied to the power supply ring through the vias, and further supplied to the internal circuit from the power supply ring (See Patent Document 1, for example).

Further, in the semiconductor device, to improve the degree of circuit integration, wiring width and so on in the semiconductor device are made smaller year by year, and the pad pitch (distance between adjacent pads) correspondingly becomes narrower. Furthermore, to reduce the size of a chip, the structure of "a pad above I/O" in which a pad is disposed above an input/output circuit (I/O) is used as necessary.

(Patent Document 1)

Japanese Patent Application Laid-open No. 2000-307063

SUMMARY OF THE INVENTION

An object of the present invention is to make it possible to provide a sufficient current from outside to a power supply ring even in a semiconductor device with a narrow-width pad such as a narrow-pitch pad or a pad above I/O.

A semiconductor device of the present invention comprises a pad composed of plural wiring layers and a power supply ring to provide a power supply to an internal circuit, and the pad for the power supply and the power supply ring are connected by vias provided respectively above and below the power supply ring.

According to the aforementioned configuration, by providing the vias respectively above and below the power supply ring, the number of vias which can be disposed to connect the pad for the power supply and the power supply ring can be at least doubled compared to the conventional one.

BRIEF DESCRIPTION OF THE DRAWINGS

FIG. 1A and FIG. 1B are diagrams showing an example of the overall configuration of a semiconductor device according to embodiments of the present invention;

FIG. 3A to FIG. 3F are diagrams showing an example of a pad above I/O in a second embodiment;

FIG. 4A to FIG. 4G are diagrams showing an example of a pad above I/O in a third embodiment.

DETAILED DESCRIPTION OF THE PREFERRED EMBODIMENTS

Figure 2A:
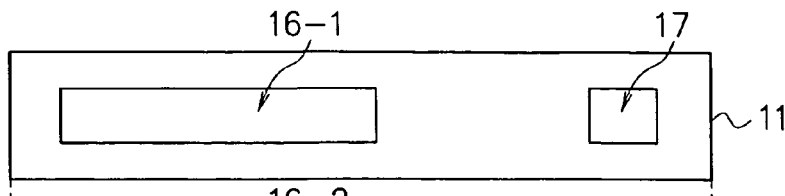
FIG. 2A to FIG. 2G are diagrams showing an example of a pad above I/O in a first embodiment.
Figure 2B:
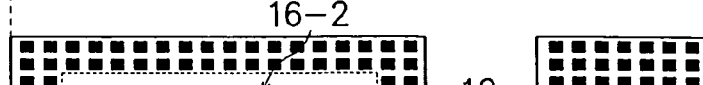
Figure 2C:
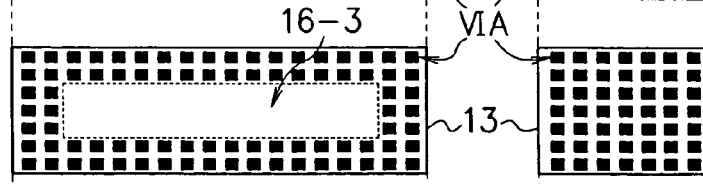
Figure 2D:
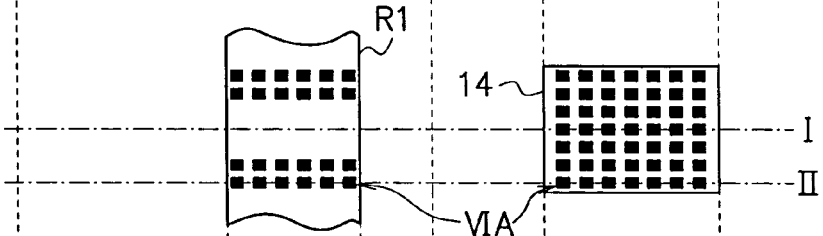
Figure 2E:
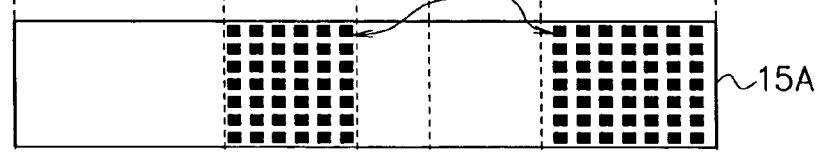

In a conventional semiconductor device with a sufficiently wide pad, many vias to electrically connect a pad and a power supply ring can be disposed between them. Therefore, a sufficient current can be provided to the power supply ring.

On the other hand, in a semiconductor device with a narrow-pitch pad whose pad pitch is narrow or a pad above I/O, the width of the pad is narrow, and thereby a region where vias can be disposed reduces. In other words, as compared with the conventional semiconductor device, the number of vias which can be disposed between the pad and the power supply ring reduces, and thereby the amount of the current provided to the power supply ring reduces. Moreover, generally in the semiconductor device with the narrow-pitch pad or the pad above I/O, the current consumption increases with an improvement in the degree of integration. As just described, in the semiconductor device with the narrow-pitch pad or the pad above I/O, the number of vias to connect the pad and the power supply ring is restricted, which makes it difficult to provide the sufficient current to the power supply ring.

Embodiments of the present invention will be described below based on the drawings.

FIG. 1A and FIG. 1B are diagrams showing an example of the overall configuration of a semiconductor device according to the embodiments of the present invention. FIG. 1A schematically shows the semiconductor device according to the present embodiments from the top side.

In FIG. 1A, numeral 1 denotes a semiconductor chip on which the semiconductor device is formed, and numeral 2 denotes a circuit region where circuits (circuit elements, wirings, and so on) can be formed in the semiconductor chip 1. Numeral 3 denotes an internal circuit formed in a central portion of the circuit region 2, and numeral 4 denotes an input/output circuit to input/output an electrical signal from/to the internal circuit 3. The input/output circuits 4 are arranged on an outer peripheral portion of the semiconductor chip 1 (circuit region 2), and pads 5 are disposed above the respective input/output circuits 4 (in such a manner that they overlap each other when viewed in the direction of a normal to a substrate). In other words, the semiconductor device according to the present embodiments shown in FIG. 1A is a semiconductor device with the structure of a pad above I/O in which the pad 5 is formed above the input/output circuit (I/O) 4.

Each of the pads 5 includes a probing part PP and a bonding part WB. The probing part PP and the bonding part WB correspond to openings of a cover film described later and are electrically connected but are regions different from each other (independent regions separated by the cover film). The probing part PP is a region to bring a probe needle into contact with at the time of a probing test (probe inspection) after the completion of a process in which an electrical signal is inputted/outputted while a probe needle is in contact to inspect an electrical characteristic. The bonding part WB is a region to be used for bonding such as wire bonding which electrically connects the semiconductor device and an external device or the like.

Numeral 8 denotes a ring-shaped power supply wiring (power supply ring) to provide a power supply provided through the pad 5 for the power supply to the internal circuit 3 and the input/output circuit 4. The power supply ring 8 is formed so as to surround the internal circuit 3 in the circuit region 2 and in a wiring layer different from an uppermost wiring layer (preferably a wiring layer lower than a third layer (including the third layer) from the top side). The power supply ring 8 is connected to the pad for the power supply. For convenience of explanation, the power supply ring shown in FIG. 1A is explained below as a power supply ring to provide a positive power supply (power supply voltage VDD) from outside to the internal circuit 3 and the input/output circuit 4, but the power supply ring to provide a negative power supply (reference potential, for example, ground GND) from outside to the internal circuit 3 and the input/output circuit 4 can be provided in the same manner.

Incidentally, the power supply ring to supply the positive power supply and the power supply ring to supply the negative power supply are each only required to be composed of a ring-shaped wiring formed so as to surround the internal circuit 3 in a wiring layer different from the uppermost wiring layer. Respective power supply rings are arbitrarily disposed unless one power supply ring is in electrical contact with a wiring containing the other power supply ring, and for example, they may be disposed so as to overlap each other when viewed from the top side (in other words, in the same shape in different wiring layers) or may be disposed in different sizes in the same wiring layer.

FIG. 1B schematically shows a section taken along the line I-I in FIG. 1A. As shown in FIG. 1B, the pad 5 is formed above the input/output circuit 4, and a cover film (cap layer) 9, for example, made of glass is formed above the pad 5. The input/output circuit 4 and the pad 5 are each composed of plural stacked wiring layers, and wirings in the respective wiring layers are electrically insulated by interlayer insulating films, and electrically connected by vias made of a conductive member as required.

Moreover, as described above, the probing part PP and the bonding part WB of the pad 5 are not covered with the cover film and are electrically connectable to the outside. In the pad 5, vias to connect wirings formed in different wiring layers with each other are generally disposed in a region (including a region below the bonding part WB) other than a region below the probing part PP. Namely, usually, in the region below the probing part PP, no via is disposed, and only an interlayer insulating film exists between wirings in the different wiring layers. This is to prevent wirings and circuits in layers below the probing part PP from suffering damage such as wear and tear and deterioration by a probing test (probe inspection) which is carried out by bringing a probe needle into contact with the probing part PP of the pad.

Figure 5A:
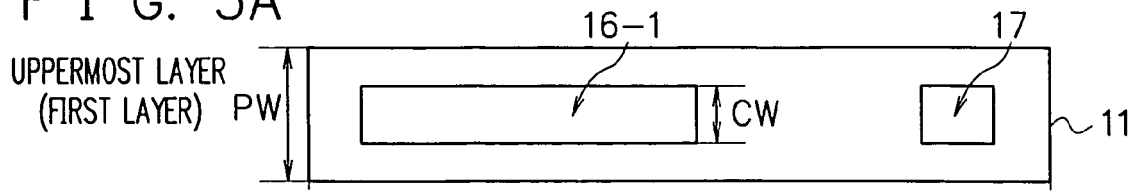
FIG. 5A to FIG. 5F are diagrams to explain a problem in a semiconductor device in which the pad above I/O is used.
Figure 5B:
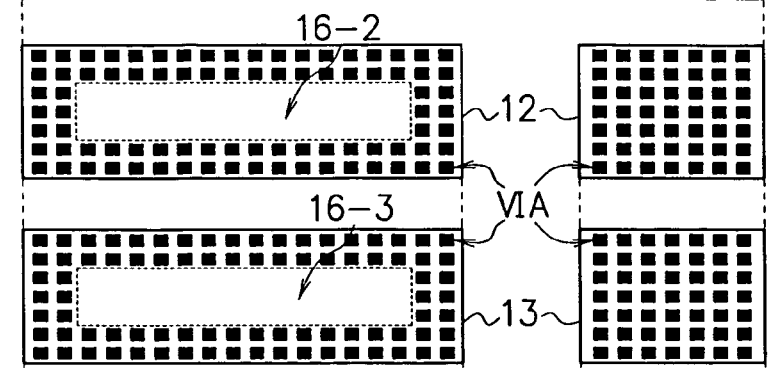
Figure 5C:
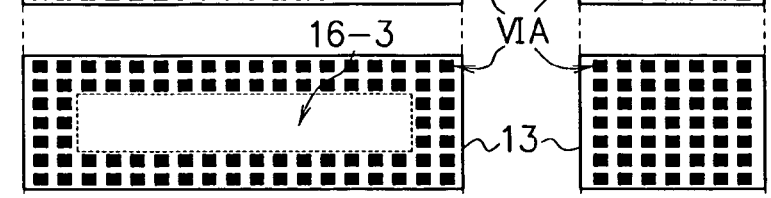
Figure 5D:
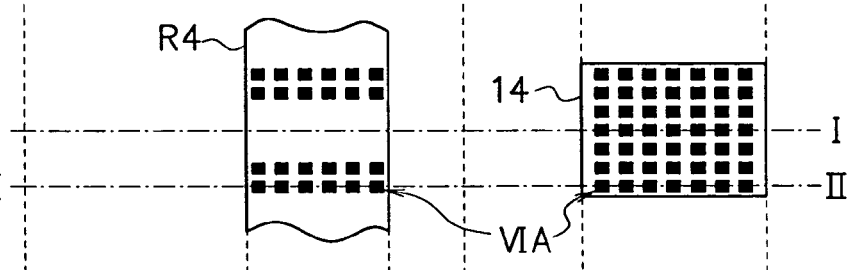
Figure 5E:
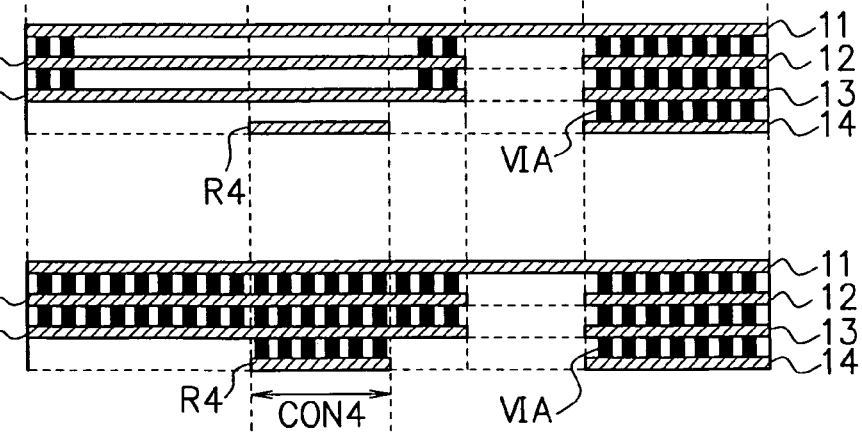
Figure 5F:
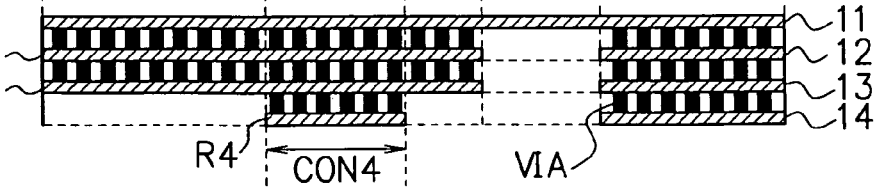

Here, the structure of the pad above I/O in the semiconductor device such as shown in FIG. 1A and FIG. 1B will be described with reference to FIG. 5A to FIG. 5F. Incidentally, in FIG. 5A to FIG. 5F, the pad for the power supply connected to a power supply terminal not shown is shown, and only a pad portion and the power supply ring placed above the input/output circuit are shown. FIG. 5A to FIG. 5D are diagrams schematically showing wirings in respective wiring layers which compose the pad. FIG. 5E and FIG. 5F, respectively, schematically show a section taken along the line I-I and a section taken along the line II-II of the pad constructed by stacking the wirings shown in FIG. 5A to FIG. 5D in sequence.

In FIG. 5A to FIG. 5F, numeral 11 denotes a wiring formed in an uppermost wiring layer (first wiring layer) which is, for example, composed of an aluminum layer. Numeral 12 denotes a wiring formed in a second wiring layer which is a layer immediately below the first wiring layer and, for example, composed of an aluminum layer or a Cu (copper) layer according to technology or the like. Similarly, numeral 13 denotes a wiring formed in a third wiring layer which is a layer immediately below the second wiring layer, numeral 14 denotes a wiring formed in a fourth wiring layer which is a layer immediately below the third wiring layer, and they are each, for example, composed of an aluminum layer or a Cu layer. Symbol R4 denotes a power supply ring, which is, as an example, formed in the fourth wiring layer. Incidentally, the wirings in the respective wiring layers and the power supply ring R4 are electrically insulated by interlayer insulating films, and electrically connected by vias described later as required.

Symbol VIA denotes a via to electrically connect wirings in different wiring layers, which is made of a conductive member (tungsten, for example). Incidentally, in FIG. 5A to FIG. 5F, in a lower side wiring, the vias VIA to connect with a wiring immediately thereabove are shown. In other words, in FIG. 5A to FIG. 5F, the vias VIA shown in an n-th wiring layer are for the purpose of electrically connecting a wiring formed in the n-th wiring layer and a wiring formed in an (n−1)-th wiring layer.

Numeral 16-1 denotes an opening region of the cover film which becomes the probing part PP, and numeral 17 denotes an opening region of the cover film which becomes the bonding part WB. Hereinafter, the opening region 16-1 of the cover film is called a "C window of the probing part PP", and the opening region 17 of the cover film is called a "C window of the bonding part WB". Incidentally, numerals 16-2 and 16-3 denote regions in the wirings 12 and 13 corresponding to the C window of the probing part PP in the uppermost layer (regions below the probing part PP).

As described above, in order to prevent the wirings and circuits in the lower layers from being damaged by the probing test (probe inspection), any via VIA to connect wirings in different wiring layers is not disposed in a region below the C window 16-1 of the probing part PP in the pad. Accordingly, the vias VIA to electrically connect the pad composed of the wirings 11 to 14 and the power supply ring R4 cannot be disposed in the whole region where the pad and the power supply ring R4 overlap each other when viewed from the top side but can be disposed only in the region except the region below the C window 16-1 of the probing part PP.

As is evident from FIG. 5A to FIG. 5F, if the pad pitch is narrowed, that is, if a width PW of the pad is narrowed, an area in which the vias VIA to connect the pad and the power supply ring R4 can be disposed reduces. Accordingly, the maximum number of vias which can be disposed reduces, which results in a reduction in the maximum supply amount of a current which can be supplied to the power supply ring R4.

As one of methods to avoid this problem, a method of inhibiting a reduction in the area in which the vias VIA to connect the pad and the power supply ring R4 can be disposed by narrowing a width CW of the C window 16-1 of the probing part PP as well as the width PW of the pad and reducing the region below the C window 16-1 is thought out. However, it is very difficult to make the probe needle used in the probing test (probe inspection) smaller, and therefore there is a limit to the width CW of the C window 16-1 of the probing part PP. Hence, it is impossible to inhibit the reduction of the number of vias which can be disposed by narrowing the width CW of the C window 16-1 of the probing part PP.

To solve the aforementioned problem, the semiconductor device according to the embodiments of the present invention is intended to increase the number of vias which connect the pad and the power supply ring to thereby increase the amount of the current which can be supplied to the power supply ring. Incidentally, in a first to third embodiments described below, an explanation of the overall configuration and the like of the semiconductor device is omitted since they are described above, and only the pad above I/O (including the power supply ring) in the semiconductor device of the present embodiments will be described. In respective figures which are referred to in the following description, the pad for the power supply connected to the power supply terminal not shown is shown, and only the pad portion and the power supply ring which are placed above the input/output circuit are shown.

First Embodiment

The first embodiment of the present invention will be described.

FIG. 2A to FIG. 2G are diagrams showing the structure of a pad above I/O in the first embodiment. FIG. 2A to FIG. 2E schematically show wirings in respective wiring layers which compose the pad, and FIG. 2F and FIG. 2G, respectively, schematically show a section taken along the line I-I and a section taken along the line II-II of the pad constructed by stacking the wirings shown in FIG. 2A to FIG. 2E in sequence. In FIG. 2A to FIG. 2G, the same numerals and symbols are used to designate the same components as those shown in FIG. 5A to FIG. 5F.

In FIG. 2A to FIG. 2G, numerals 11, 12, 13, 14, and 15A denote wirings formed in the first wiring layer, the second wiring layer, the third wiring layer, the fourth wiring layer, and a fifth wiring layer, respectively. The fifth wiring layer is a wiring layer immediately below the fourth wiring layer. The wiring 11 is, for example, composed of an aluminum layer, and the wirings 12, 13, 14, and 15A are each, for example, composed of an aluminum layer or a Cu layer. Symbol R1 denotes a power supply ring, which is, as an example, formed in the fourth wiring layer. Incidentally, the wirings in the respective wiring layers and the power supply ring R1 are electrically insulated by interlayer insulating films, and electrically connected by vias described later as required.

Symbol VIA denotes a via to electrically connect wirings in different wiring layers, and the wiring in the n-th wiring layer and the wiring in the (n−1)-th wiring layer are electrically connected by the vias VIA shown in the n-th wiring layer. This via VIA is made of a conductive member (tungsten, for example). Numeral 16-1 denotes the C window (opening region of the cover film) of the probing part PP, numeral 17 denotes the C window (opening region of the cover film) of the bonding part WB. Numerals 16-2 and 16-3 denote regions in the wirings 12 and 13 corresponding to the C window 16-1 of the probing part PP (regions below the probing part PP).

As shown in FIG. 2A to FIG. 2G, in the pad above I/O in the first embodiment, with respect to the fourth wiring layer in which the power supply ring R1 is formed, the wirings 13 and 15A are respectively formed in the third wiring layer immediately thereabove and the fifth wiring layer immediately therebelow. The wirings 13 and 15A are each formed to include a region which overlaps the power supply ring R1 when viewed from the top side (in the direction of the normal to the substrate).

The wiring 13 in the third wiring layer and the power supply ring R1 formed in the fourth wiring layer are electrically connected by the vias VIA disposed in a region where they overlap each other except the region below the probing part PP when viewed from the top side. The power supply ring R1 formed in the fourth wiring layer and the wiring 15A in the fifth wiring layer are electrically connected by the vias VIA disposed in a region where they overlap each other when viewed from the top side. Incidentally, the vias VIA which connect the power supply ring R1 and the wiring 15A can be arbitrarily disposed in the region where the power supply ring R1 and the wiring 15A overlap each other when viewed from the top side, and in the example shown in FIG. 2A to FIG. 2G, the vias VIA are disposed in all of this region.

As just described, as concerns the connection of the wiring 13 in the third wiring layer and the power supply ring R1 in the fourth wiring layer, since the power supply ring R1 may be damaged by the probing test (probe inspection), no via VIA is disposed in the region below the probing part PP, and the vias VIA are disposed in the region other than this. On the other hand, as concerns the connection of the power supply ring R1 in the fourth wiring layer and the wiring 15A in the fifth wiring layer, since there is no possibility of damage caused by the probing test (probe inspection), the vias VIA are arbitrarily disposed.

The wiring 13 in the third wiring layer on the side upper than the power supply ring R1 is electrically connected to the wiring 11 in the first wiring layer connected to an external power supply by the vias VIA disposed outside a probing part PP region, and the wiring 15A in the fifth wiring layer on the side lower than the power supply ring R1 is electrically connected to the wiring 11 in the first wiring layer by the vias VIA disposed in a bonding part WB region. Namely, by disposing the vias VIA in the bonding part WB, the current can be supplied to the wiring in the wiring layer lower than the wiring layer in which the power supply ring R1 is formed. Incidentally, a place where the vias VIA which connect the wirings in the respective layers to supply the current to the wiring in the wiring layer lower than the wiring layer in which the power supply ring R1 is formed are disposed is not limited to the bonding part WB but is arbitrary as long as the place is below the wiring 11 in the first wiring layer (provided that the probing part PP region is excepted).

As described above, the wirings 13 and 15A which are connected to the wiring 11 in the first wiring layer connected to the external power supply are formed so as to include regions which overlap each other when viewed from the top side above and below the power supply ring R1 (so that the power supply ring R1 is vertically sandwiched therebetween), and the vias VIA which connect the power supply ring R1 and the wirings 13 and 15A respectively are disposed.

Figure 2F:
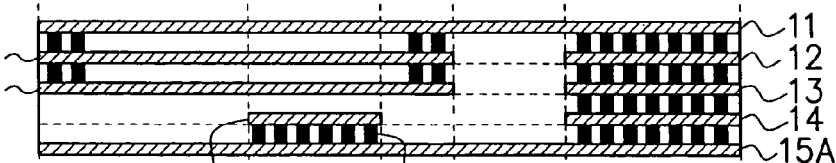

Consequently, as the section is shown in FIG. 2F, the power supply ring R1 and the wiring 15A in the layer therebelow are connected by the vias VIA in the region where the power supply ring R1 and the wirings 13 and 15A overlap one another when viewed from the top side and also below the probing part PP in the pad. Namely in this region, the current can be supplied to the power supply ring R1 through the wiring 15A in the layer therebelow.

Figure 2G:
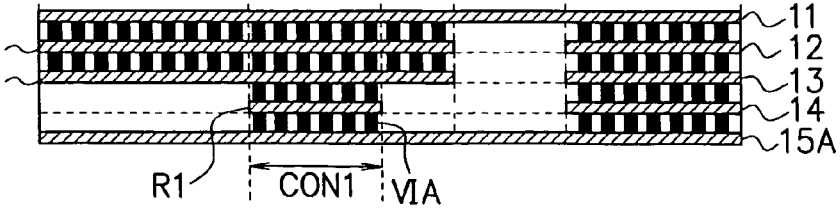

Moreover, as the section is shown in FIG. 2G, the power supply ring R1 and both the wiring 13 in the layer thereabove and the wiring 15A in the layer therebelow are connected by vias VIA in the region where the power supply ring R1 and the wirings 13 and 15A overlap one another except the region below the probing part PP when viewed from the top side. Namely, the current can be supplied to the power supply ring R1 from both the upper side and the lower side through the wiring 13 in the layer thereabove and the wiring 15A in the layer therebelow.

As described above, according to the first embodiment, the wirings 13 and 15A are formed so as to include the regions which overlap each other when viewed from the top side above and below the power supply ring R1, and the power supply rings R1 and the wirings 13 and 15A are connected by the vias VIA. Namely, the vias VIA are disposed on both the upper layer side and the lower layer side of the power supply ring R1 so that the current can be supplied to the power supply ring R1 from both the wirings 13 and 15A.

Consequently, as is evident from a comparison of FIG. 2A to FIG. 2G and FIG. 5A to FIG. 5F, the number of vias VIA to supply the current to the power supply ring R1 can be at least doubled compared to the conventional one, the amount of the current supplied to the power supply ring R1 can be at least doubled compared to the conventional one, and the sufficient current from outside can be supplied to the power supply ring. Further, the vias VIA which connect the power supply ring R1 and the wiring 15A in the layer therebelow can be provided in any given region where the power supply ring R1 and the wiring 15A overlap each other when viewed from the top side regardless of the region below the probing part PP or not, whereby many vias VIA to supply the current to the power supply ring R1 can be disposed, which makes it possible to remarkably increase current supply capacity for the power supply ring R1 as compared with the conventional one.

The first embodiment is effective in a case where in the narrow-pitch pad above I/O, the power supply ring is placed in the region below the probing part PP thereof. For example, in the 40 μm pitch pad above I/O, the width of the C window of the probing part PP is 34 μm, and therefore conventionally the width in which vias to connect the power supply ring and the pad can be disposed was 4 μm with consideration given to manufacturing errors and the so on, but by applying the first embodiment, the same effect as a width of 8 μm which is double can be obtained, which enables the supply of the sufficient current to the power supply ring.

Second Embodiment

Next, the second embodiment of the present invention will be described.

FIG. 3A to FIG. 3F are diagrams showing the structure of a pad above I/O in the second embodiment. FIG. 3A to FIG. 3D schematically show wirings in respective wiring layers which compose the pad, and FIG. 3E and FIG. 3F, respectively, schematically show a section taken along the line I-I and a section taken along the line II-II of the pad constructed by stacking the wirings shown in FIG. 3A to FIG. 3D in sequence. In FIG. 3A to FIG. 3F, the same numerals and symbols are used to designate the same components as those shown in FIG. 2A to FIG. 2G, and duplicate explanation is omitted.

In FIG. 3A to FIG. 3F, symbol R2 denotes a power supply ring, which is, as an example, formed in the fourth wiring layer. Similarly to the first embodiment, in FIG. 3A to FIG. 3F, the vias VIA shown in the n-th wiring layer electrically connect the wiring in the n-th wiring layer and the wiring in the (n–1)-th wiring layer.

The power supply ring R2 in the second embodiment is formed so that the width of the power supply ring R2 is partially extended in such a manner that the area of a region which overlaps with the wiring 13 in the third wiring layer (except a region below the probing part PP) when viewed from the top side increases, that is, a region where the vias VIA to connect the power supply ring R2 and the wiring 13 can be disposed widens.

In the example shown in FIG. 3A to FIG. 3F, the power supply ring R2 which is formed so as to intersect the wiring 13 having a rectangular shape when viewed from the top side is extended in a long side direction of the wiring 13 in a region below the wiring 13 except the region below the probing part PP, and as a result, the width thereof becomes CON2B. The width of the power supply ring R2 in the region other than this is CON2A (CON2A<CON2B). Namely, the width CON2B of the power supply ring R2 in the region which overlaps with the pad (except the region below the probing part PP) when viewed from the top side is wider than the width CON2A of the power supply ring R2 outside this region.

Hence, the wiring 13 and the power supply ring R2 are connected by the vias VIA in the region where they overlap each other except the region below the probing part PP when viewed from the top side. Incidentally, the wiring 13 is electrically connected to the wiring 11 in the first wiring layer which is connected to the external power supply by the vias VIA disposed outside the probing part PP region.

As just described, the width of the power supply ring R2 is partially extended in such a manner that the area of the region which overlaps with the wiring 13 in the third wiring layer (except the region below the probing part PP) when viewed from the top side increases, that is, the region where the vias VIA to connect the wiring 13 and the power supply ring R2 can be disposed increases, and the vias VIA which connects the power supply ring R2 and the wiring 13 are disposed.

Accordingly, as the sections are shown in FIG. 3E and FIG. 3F, the vias VIA to connect the power supply ring R2 and the wiring 13 are not disposed in the region below the probing part PP out of the region where the power supply ring R2 and the wiring 13 overlap each other when viewed from the top side as in the prior art, but outside the region below the probing part PP, they can be disposed in the region with the width CON2B wider than the normal width CON2A. Hence, the number of vias VIA to supply the current to the power supply ring R2 can be increased, which makes it possible to supply more current from outside to the power supply ring as compared to the conventional one.

Incidentally, in the example shown in FIG. 3A to FIG. 3F, the width of the power supply ring R2 is extended only in the region below the wiring 13 except the region below the probing part PP, but without limiting to this, the width of the power supply ring R2 may be extended in the region below the wiring 13 containing the region below the probing part PP although the number of vias which can be disposed is the same as in the second embodiment.

Third Embodiment

Next, the third embodiment of the present invention will be described. Both the first embodiment and second embodiment are applied to the third embodiment described below.

FIG. 4A to FIG. 4G are diagrams showing the structure of a pad above I/O in the third embodiment. FIG. 4A to FIG. 4E schematically show wirings in respective wiring layers which compose the pad, and FIG. 4F and FIG. 4G, respectively, schematically show a section taken along the line I-I and a section taken along the line II-II of the pad constructed by stacking the wirings shown in FIG. 4A to FIG. 4E in sequence. In FIG. 4A to FIG. 4G, the same numerals and symbols are used to designate the same components as those shown in FIG. 2A to FIG. 2G, and duplicate explanation is omitted.

In FIG. 4A to FIG. 4G, numeral 15B denotes a wiring formed in the fifth wiring layer. Symbol R3 denotes a power supply ring, which is, as an example, formed in the fourth wiring layer. Similarly to the first and second embodiments, in FIG. 4A to FIG. 4G, the vias VIA shown in the n-th wiring layer electrically connect the wiring in the n-th wiring layer and the wiring in the (n−1)-th wiring layer.

As described above, the third embodiment has both characteristics of the first embodiment and the second embodiment, and the power supply ring R3 in the third embodiment is formed in the same manner as the power supply ring R2 in the second embodiment. Namely, the power supply ring R3 is formed so that the width of the power supply ring R3 is partially extended in such a manner that the area of a region which overlaps the wiring 13 in the third wiring layer and the wiring 15B in the fifth wiring layer when viewed from the top side increases, that is, a region where the vias VIA which connect the power supply ring R3 and the wirings 13 and 15B can be disposed widens.

Moreover, the wirings 13 and 15B are formed so as to include regions which overlap each other when viewed from the top side above and below the power supply ring R3, and the vias VIA are disposed on both the upper layer side and the lower layer side of the power supply ring R3 so that the current can be supplied to the power supply ring R3 from both the wirings 13 and 15B, and the power supply ring R3 and the wirings 13 and 15B are connected by the vias VIA.

Consequently, similarly to the first embodiment, by disposing the vias VIA on both the upper layer side and the lower layer side of the power supply ring R3, the number of vias VIA to supply the current to the power supply ring R3 can be at least doubled compared to the conventional one, and hence the amount of the current supplied to the power supply ring R3 can be at least doubled compared to the conventional one. Further, in the region where the power supply ring R3 and the wirings 13 and 15B overlap one another when viewed from the top side and outside the region below the probing part PP, the vias VIA can be disposed in the region with a width CON3B wider than a normal width CON3A, whereby the number of vias VIA to supply the current to the power supply ring R3 can be increased. Accordingly, the sufficient current from outside can be supplied to the power supply ring.

Incidentally, without limiting to the example shown in FIG. 4A to FIG. 4G, the width of the power supply ring R3 may be extended also in the region below the probing part PP, and in this case, the number of vias VIA which connect the power supply ring R3 and the wiring 15B can be further increased.

Incidentally, in the pad above I/O in each of the embodiments shown, to make the probing part PP and the bonding part WB in the pad easily understandable, the wiring 12 in the second wiring layer and the wiring 13 in the third wiring layer are divided into two sections respectively corresponding to these regions, but the wirings 12 and 13 each may be one continuous wiring such as the wiring 15A or 15B in the fifth wiring layer. In this case, the vias VIA may be additionally provided.

Moreover, in the first to third embodiments, the cases where the power supply rings R1, R2, and R3 are provided in the fourth wiring layer are shown as an example, but the wiring layer in which the power supply ring is formed is arbitrary as long as the wiring layer is different from the uppermost wiring layer.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

According to the present invention, by providing vias respectively above and below a power supply ring to connect a pad for a power supply and the power supply ring, the number of vias disposed to provide a current to the power supply ring can be at least doubled compared to the conventional one, and hence the amount of the current provided to the power supply ring can be at least doubled compared to the conventional one. Accordingly, even if the width of the pad is narrowed, sufficient vias to provide the current to the power supply ring can be provided, which makes it possible to provide the sufficient current from outside to the power supply ring.

What is claimed is:

1. A semiconductor device, comprising:
   a pad composed of plural wiring layers; and
   a power supply ring formed so as to surround a circuit region where an internal circuit is formed in order to provide a power supply provided through said pad for the power supply to the internal circuit,
   said pad for the power supply and said power supply ring being connected by vias provided above and below said power supply ring;
   wherein said wiring layers of said pad for the power supply are disposed above and below said power supply ring so that they overlap at least partly with said power supply ring when viewed in a direction normal to the substrate.

2. The semiconductor device according to claim 1, wherein the vias provided below said power supply ring to connect with said pad for the power supply are arbitrarily disposed in a region where said pad for the power supply and said power supply ring overlap each other when viewed in a direction of a normal to a substrate.

3. The semiconductor device according to claim 2, wherein the vias provided below said power supply ring to connect with said pad for the power supply are connected to a bonding region of said pad for the power supply through a wiring layer lower than said power supply ring.

4. The semiconductor device according to claim 1, wherein the vias provided above said power supply ring to connect with said pad for the power supply are disposed in a region except a region corresponding to a probing test region of said pad.

5. The semiconductor device according to claim 1, wherein
   said pad for the power supply includes a probing test region and a bonding region, and
   the vias provided above said power supply ring to connect with said pad for the power supply are connected to a region surrounding the probing test region of said pad for the power supply, and the vias provided below said power supply ring to connect with said pad for the power supply are connected to the bonding region of said pad for the power supply through a wiring layer lower than said power supply ring.

6. The semiconductor device according to claim 1, wherein said power supply ring is partially extended in a region that overlaps said pad for the power supply when viewed in a direction of a normal to a substrate so that the overlapping region is widened.

7. The semiconductor device according to claim 1, wherein a width of said power supply ring in a region which overlaps said pad for the power supply when viewed in a direction of a normal to a substrate is wider than a width of said power supply ring in a region different from the overlapping region.

8. The semiconductor device according to claim 7, wherein only in the region which overlaps said pad for the power supply when viewed in the direction of the normal to the substrate except a probing test region of said pad, the width of said power supply ring is wider than the width of said power supply ring in the region different from the overlapping region.

9. The semiconductor device according to claim 1, wherein said pad is placed on an input/output circuit.

10. The semiconductor device according to claim 1, wherein
said pad is composed of m wiring layers (m is a natural number equal to or more than 4), and
said power supply ring is formed in an n-th wiring layer (n is equal to or more than 3 and equal to or less than (m−1)) from a top side of the m wiring layers so as to intersect said pad for the power supply when viewed in a direction of a normal to a substrate and connected to an (n−1)-th wiring layer and an (n+1)-th wiring layer of said pad for the power supply respectively by the vias provided above and below said power supply ring.

11. The semiconductor device according to claim 10, wherein only an insulating film exists between the (n−1)-th wiring layer of said pad for the power supply and said power supply ring corresponding to a probing test region of said pad.

12. The semiconductor device according to claim 10, wherein said pad is disposed above an input/output circuit.

13. A semiconductor device, comprising:
a pad composed of plural wiring layers; and
a power supply ring formed so as to surround a circuit region where an internal circuit is formed in order to provide a power supply provided through said pad for the power supply to the internal circuit, wherein
said power supply ring is partially extended in a region which overlaps said pad for the power supply when viewed in a direction of a normal to a substrate so that the region is widened, and said pad for the power supply and said power supply ring are connected by vias provided in the region.

14. A semiconductor device, comprising:
a pad composed of plural wiring layers; and
a power supply ring formed so as to surround a circuit region where an internal circuit is formed in order to provide a power supply provided through said pad for the power supply to the internal circuit, wherein
a width of said power supply ring in a region which overlaps said pad for the power supply when viewed in a direction of a normal to a substrate is wider than a width of said power supply ring in a region different from the overlapping region, and said pad for the power supply and said power supply ring are connected by vias provided in the overlapping region.

15. The semiconductor device according to claim 14, wherein only in the region which overlaps said pad for the power supply when viewed in the direction of the normal to the substrate except a probing test region of said pad, the width of said power supply ring is wider than the width of said power supply ring in the region different from the overlapping region.

16. The semiconductor device according to claim 14, wherein said pad is disposed above an input/output circuit.

* * * * *